United States Patent [19]
Oosawa et al.

[11] Patent Number: 5,721,447
[45] Date of Patent: Feb. 24, 1998

[54] PHOTODETECTOR AND A METHOD FOR THE FABRICATION THEREOF

[75] Inventors: Katuichi Oosawa, Osaka; Katuhiko Oimura, Shiga; Hideaki Usukubo, Osaka, all of Japan

[73] Assignee: Matsushita Electronics Corporation, Osaka, Japan

[21] Appl. No.: 628,424

[22] Filed: Apr. 5, 1996

[30] Foreign Application Priority Data

Apr. 5, 1995 [JP] Japan .................... 7-080115

[51] Int. Cl.$^6$ .................... H01L 31/05; H01L 31/00
[52] U.S. Cl. .................... 257/461; 257/435; 257/446; 257/448; 257/459
[58] Field of Search .................... 257/435, 446, 257/448, 459, 461

[56] References Cited

U.S. PATENT DOCUMENTS 5,576,761  11/1996  Iwamoto .................... 257/448
5,602,415  2/1997  Kubo et al. .................... 257/443

*Primary Examiner*—Ngan V. Ngo
*Attorney, Agent, or Firm*—McDermott, Will & Emery

[57] ABSTRACT

This invention provides an improved photodetector with the availability of various amplifiers and with a small circuit scale. A first light-receiving element $PD_1$ is composed of a first impurity region of the n-type formed on a p-type semiconductor substrate and a second impurity region of the p-type formed at a surface zone of the first impurity region. A second light-receiving element $PD_2$ is composed of the semiconductor substrate and a third impurity region of the n-type. $PD_1$ and $PD_2$ are connected together in series. Such arrangement makes it possible to reduce the circuit scale of photodetectors if a bipolar transistor or the like is used as an amplifier means. The photosensitivity becomes higher since reverse-bias voltages are applied to $PD_1$ and $PD_2$. Additionally, it is possible to set a wavelength band for light to be detected, according to the area ratio of $PD_1$ and $PD_2$.

16 Claims, 10 Drawing Sheets an n-type impurity region. As a result, the photosensitivity of each light-receiving element becomes poor. This gives rise to a further problem that the area of the light-receiving element must be extended for achieving better photosensitivity.

If a light-receiving element is irradiated with a spot of light beams smaller than the area of a light-receiving element, this produces another problem that it is impossible to detect the amount of light in a target wavelength band.

PHOTODETECTOR AND A METHOD FOR THE FABRICATION THEREOF

BACKGROUND OF THE INVENTION

This invention relates to a photodetector and to a photodetector fabrication method.

Various photodetectors have been used to detect the presence of light. A typical photodetector includes a light-receiving element formed by, for example, a silicon photodiode. Either an optical filter or a spectroscope is arranged before the light-receiving element so that only light within a target wavelength band strikes upon the light-receiving element.

The problem with such photodetectors is that they are large in size and expensive. With a view to solving this problem, Japanese Patent Applications, published under Pub. Nos. 63-65325 and 2-291182, each propose a photodetector.

FIG. 10 schematically shows the structure of a photodetector in accordance with Japanese Patent Application 2-291182. 41 is a sensor complex. 42 is an amplifier formed of, for example, an operational amplifier. 43 is a resistor. 44 and 45 are interconnect lines. 46 is a p-type semiconductor substrate. 47 and 48 are n-type impurity regions. 49 is a p-type impurity region.

The photodetector shown in FIG. 10 has, as its major elements, the sensor complex 41 and the amplifier 42. The sensor complex 41 has a first light-receiving element $PD'_1$, a second light-receiving element $PD'_2$, and the interconnect lines 44 and 45. The first and second elements $PD'_1$ and $PD'_2$ have different photodetection characteristics and are connected together in "reverse parallel" by the lines 44 and 45. The element $PD'_1$ is a photodiode composed of the substrate 46 and the region 47. The element $PD'_2$ is a photodiode composed of the region 48 and the region 49. By "be connected together in reverse parallel", what is meant is that the photodiodes are in-parallel connected in a reverse fashion in polarity. The amplifier 42 amplifies the difference between an output current from the element $PD'_1$ and an output current from the element $PD'_2$.

In the above-described photodetector, when light enters the elements $PD'_1$ and $PD'_2$, different photocurrents are generated in these two light-receiving elements because of their different photodetection characteristics. The difference between the photocurrents thus generated is fed, through the line 44, to the amplifier 42. The amount of photocurrent generated is proportional to the amount of light within a wavelength band that each light-receiving element can sense.

Conventional photodetectors, however, suffer from the following drawbacks.

In the above-described photodetector, the lines 44 and 45 connect the elements $PD'_1$ and $PD'_2$ in a reverse parallel fashion. In such a case, however, if a reverse-bias voltage is applied to one of the light-receiving elements, then an excessive forward current flows in the other light-receiving element. Therefore, no reverse-bias voltage can be applied. For this reason, the type of amplifier for amplifying the difference between photocurrents is limited to a double power supply type (positive and negative) amplifier in which the input bias-voltage is 0 V. As a result, the circuit scale becomes larger.

No reverse-bias voltage can be applied for the above-described reason, which prevents depletion layer expansion at a junction surface between a p-type impurity region and

SUMMARY OF THE INVENTION

Accordingly, it is an object of the present invention to provide a small circuit-scale photodetector capable of making use of various amplifiers and a fabrication method thereof. Further, it is another object of the present invention to provide an improved photodetector with the feature that its light-receiving element has high photosensitivity and a fabrication method thereof. Furthermore, it is still another object of the present invention to provide an improved photodetector capable of, even when a light-receiving element of the photodetector is irradiated with a spot of light beams which is smaller than the area of that light-receiving element, detecting the amount of light in a target wavelength band.

The present invention provides a photodetector. The present photodetector comprises:

(a) a first light-receiving element;
the first-receiving element including:
    a first impurity region of the second conductivity type which is formed on a semiconductor substrate of the first conductivity type;
    a second impurity region of the first conductivity type which is formed on the first impurity region;

(b) a second light-receiving element;
the second light-receiving element including:
    the substrate;
    a third impurity region of the second conductivity type which is formed on the substrate;
    the second light-receiving element differing in photodetection characteristic from the first light-receiving element;
    the second light-receiving element being coupled in series to the first light-receiving element;

(c) amplification means for inputting, from a junction point of the first light-receiving element and the second light-receiving element, another differential current which is the difference between a photocurrent generated in the first light-receiving element and a photocurrent generated in the second light-receiving element, and for amplifying the differential current.

When the first and second light-receiving elements are irradiated with light beams, different photocurrents flow in the first and second light-receiving elements because these elements have different photodetection characteristics. The difference between these two photocurrents is amplified by the amplification means and the output current of the amplification means is proportional to the amount of light in a target wavelength band. The first and second light-receiving elements are connected together in series, which makes it possible to employ various amplification means. For example, the use of bipolar transistors reduces not only the circuit scale of photodetectors but also the costs of production.

In the above-described photodetector, the first impurity region of the second conductivity type and the third impurity region of the second conductivity type may be formed of an epitaxial layer.

Accordingly, the first and third impurity regions are formed uniformly having a low concentration. Carriers generated by illumination come to have a longer lifetime. This achieves high absorptivity and high photosensitivity.

The first and second light-receiving elements may be fed reverse-bias voltages. This causes depletion layer regions of the elements to expand, therefore achieving high photosensitivity. In addition, the junction capacitance is improved together with the frequency characteristic.

The target wavelength band may be set according to the area ratio of the first light-receiving element and the second light-receiving element. This eliminates the need for changing the concentration and depth of the first to third impurity regions for target wavelength band setting. The wavelength band can be set easily according to the area ratio.

The first and second light-receiving elements may have surface patterns that fit in each other in multiple. As a result of such arrangement, even when irradiated with a spot of light beams which is smaller than the area of a light-receiving element, the amount of light in a target wavelength band can be detected.

The present invention provides a photodetector. This photodetector comprises:

(a) a first light-receiving element and a second light-receiving element, the elements being connected together in series;

(b) a third light-receiving element;
the third light-receiving element being connected in parallel with the second light-receiving element;
the third light-receiving element being identical in dark current characteristic with the first light-receiving element;
the third light-receiving element being covered from light;

(c) a fourth light-receiving element;
the fourth light-receiving element being connected in parallel with the first light-receiving element;
the fourth light-receiving element being identical in dark current characteristic with the second light-receiving element;
the fourth light-receiving element being covered from light;

(d) amplification means for inputting, from a junction point of the first light-receiving element and the second light-receiving element, a differential current which is the difference between a photocurrent generated in the first light-receiving element and another photocurrent generated in the second light-receiving element, and for amplifying the different current.

A dark current of the first light-receiving element is offset by a dark current of the third light-receiving element. Likewise, a dark current of the second light-receiving element is offset by a dark current of the fourth light-receiving element. This does not affect the photodetection characteristic of the entire photodetector, since the third and fourth light-receiving elements are covered from the light. Accordingly the occurrence of an offset potential due to dark current flowing in each light-receiving element can be prevented.

The present invention provides a method of fabricating a photodetector having:

(a) a first light-receiving element;
the first-receiving element including:
a first impurity region of the second conductivity type which is formed on a semiconductor substrate of the first conductivity type;
a second impurity region of the first conductivity type which is formed on the first impurity region;

(b) a second light-receiving element;
the second light-receiving element including:
the substrate;
a third impurity region of the second conductivity type which is formed on the substrate;
the second light-receiving element differing in photodetection characteristic from the first light-receiving element;
the second light-receiving element being coupled in series to the first light-receiving element;

(c) amplification means having an amplifier composed of a plurality of impurity regions formed on the substrate for inputting, from a junction point of the first light-receiving element and the second light-receiving element, a differential current which is the difference between a photocurrent generated in the first light-receiving element and another photocurrent generated in the second light-receiving element, and for amplifying the differential current;

the method comprising the step of:
forming at least one of the plural impurity regions simultaneously with at least one of the first, second, and third impurity regions in a one stage diffusion process.

In accordance with this photodetector fabrication method, diffusion can be simplified at the time each light-receiving element and the amplifier are integrated. There is no increase in the number of diffusion steps.

The present invention provides a method of fabricating a photodetector having:

(a) a first light-receiving element;
the first light-receiving element including:
a first impurity region of the second conductivity type formed of an epitaxial layer grown on a semiconductor substrate of the first conductivity type;
a second impurity region of the first conductivity type which is formed on the first impurity region;

(b) a second light-receiving element;
the second light-receiving element including:
the substrate;
a third impurity region of the second conductivity type formed of the epitaxial layer;
the second light-receiving element differing in photodetection characteristic from the first light-receiving element;
the second light-receiving element being coupled in series to the first light-receiving element;

(c) a bipolar transistor having a base region;
the base region being formed in an epitaxial layer separated by an isolation region from the first and third impurity regions;
the base region being connected with a junction point of the first light-receiving element and the second light-receiving element;

the method comprising the step of:
forming the base region simultaneously with the second impurity region in a one stage diffusion process.

In accordance with this photodetector fabrication method, diffusion can be simplified at the time each light-receiving element and the bipolar transistor are integrated. The increase in the number of diffusion steps.

DETAILED DESCRIPTION OF THE INVENTION

Preferred embodiments of the present invention are described below with reference to the accompanying drawing figures. Note that in the description the first conductivity type means "p-type" while the second conductivity type means "n-type".

EMBODIMENT 1

Figure 1:
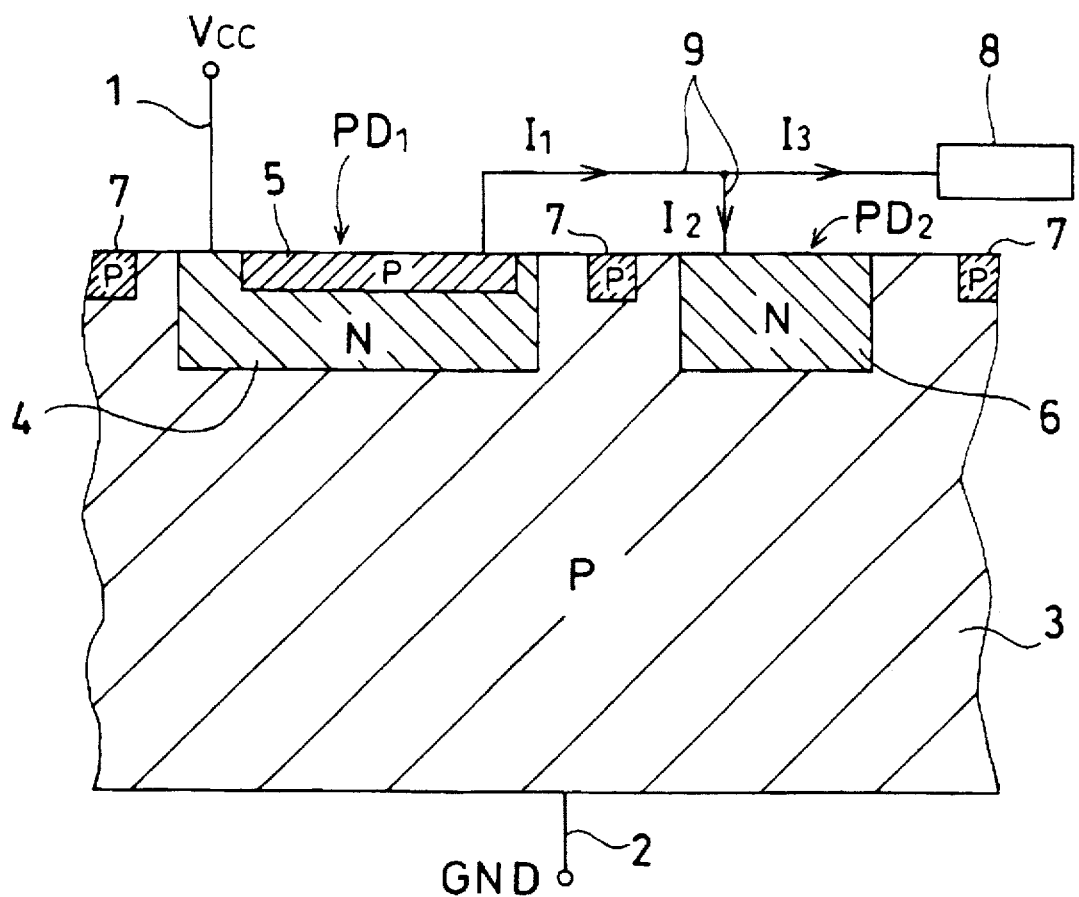
FIG. 1 depicts the structure of a photodetector formed in accordance with a first embodiment of the present invention.

A photodetector of the first embodiment is described with reference to FIG. 1. $PD_1$ is a first light-receiving element (LRE). $PD_2$ is a second LRE. 1, 2, and 9 are interconnect lines. 3 is a p-type semiconductor substrate. 4 is an n-type first impurity region. 5 is a p-type second impurity region. 6 is an n-type third impurity region. 7 is a p-type isolation region. 8 is an amplifier.

The present photodetector has, as its major elements, the first LRE $PD_1$, the second LRE $PD_2$, and the amplifier 8. The first LRE $PD_1$ is a photodiode which detects light of short wavelengths and has a peak sensitivity wavelength of 560 nm. This photodiode is formed of the n-type first impurity region 4 and the p-type second impurity region 5. While the n-type first impurity region 4 is a lightly phosphorus-doped, deep region formed in the substrate 3, (surface concentration: below $10^{-16}$ cm$^{-2}$; depth: above 3 μm), the p-type second impurity region 5 is a boron-doped, shallow region formed at a surface zone of the n-type first impurity region 4 (surface concentration: above $10^{-18}$ cm$^{-2}$; depth: below 2 μm).

The second LRE $PD_2$ is a photodiode which detects light of long wavelengths and has a peak sensitivity wavelength of 880 nm. This photodiode is formed of the substrate 3 and the n-type third impurity region 6 which is a lightly phosphorus-doped, deep region formed in the substrate 3 (surface concentration: below $10^{-16}$ cm$^{-2}$; depth: above 3 μm).

Figure 7:
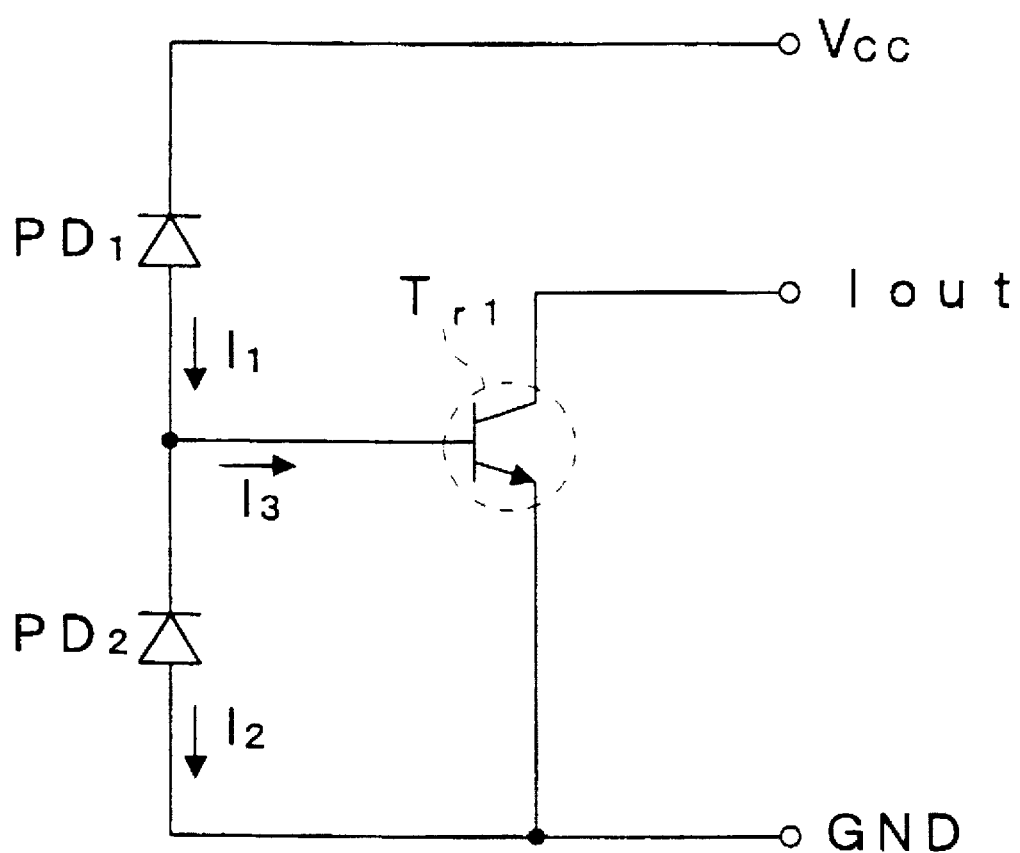
FIG. 7 is a circuit diagram showing an example of the present invention in which an amplifier is formed by a bipolar transistor.

The interconnect line 9 connects in series the p-type second impurity region 5 of the first LRE $PD_1$ and the n-type third impurity region 6 of the second LRE $PD_2$. This establishes in-series connection between the two photodiodes and the junction point between the photodiodes is connected with the amplifier 8. An example, in which the amplifier 8 is formed by a bipolar transistor, is shown in FIG. 7. This is described later in the second embodiment.

Figure 2:
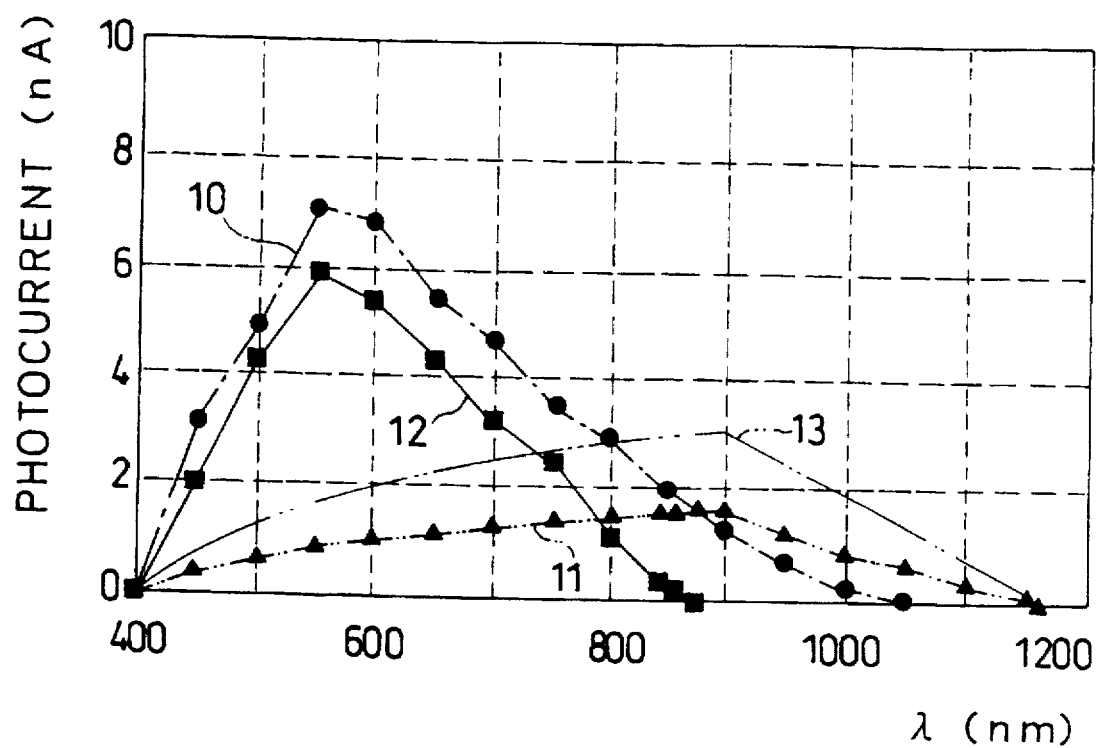
FIG. 2 shows graphically the photodetection characteristics of a photodetector formed in accordance with the first embodiment.

FIG. 2 shows graphically the photodetection characteristics of the present photodetector. In the graph of FIG. 2, the ordinate indicates the photocurrent (nA) while the abscissa indicates the light wavelength λ (nm). Reference numerals 10, 11, and 12 indicate the first LRE's $PD_1$ photodetection characteristic, the second LRE's $PD_2$ photodetection characteristic, and the photodetection characteristic of the entire photodetector of FIG. 1, respectively. Reference numeral 13 indicates an estimated photodetection characteristic of the second LRE $PD_2$ when the area of the second LRE $PD_2$ is doubled. There is the relationship between the photocurrent (the ordinate of the graph) and the photosensitivity, that is, (photocurrent=photosensitivity× light power×LRE's area). In the present embodiment, the area ratio of the first LRE $PD_1$ and the second LRE $PD_2$=5:1.

The operation of the present photodetector is illustrated with reference to FIGS. 1 and 2.

In the present photodetector, the line 1 is coupled to $V_{CC}$ which is a positive power supply, or a reference voltage of the positive polarity. The line 2 is coupled to GND (ground). The potential of the line 9 lies between $V_{CC}$ and GND. The first and second LREs $PD_1$ and $PD_2$ are provided with respective reverse-bias voltages. When light falls upon the first LRE $PD_1$ and upon the second LRE $PD_2$, a photocurrent $I_1$ flows in the first LRE $PD_1$ according to the photodetection characteristic 10 (peak light wavelength (λ)=560 nm) and a photocurrent $I_2$ flows in the second LRE $PD_2$ according to the photodetection characteristic 11 (peak light wavelength (λ)=880 nm). The difference between $I_1$ and $I_2$ (i.e., a differential current $I_3$) is provided at the junction point between the first and second LREs $PD_1$ and $PD_2$ for forwarding to the amplifier 8 where the current $I_3$ is amplified.

The light wavelength at the intersection of the characteristic 10 and the characteristic 11 is 880 nm. Therefore, of all photocurrents generated in the first LRE $PD_1$, photocurrents of light components having λ of above 880 nm are offset by their counterparts generated in the second LRE $PD_2$ (i.e., photocurrents of light components having λ of above 880 nm of all photocurrents generated in the second LRE $PD_2$). As the differential current $I_3$, a current, which is proportional to the amount of light of all irradiated light in a target wavelength band according to the characteristic 12, is obtained.

In the present embodiment, the first and second LREs $PD_1$ and $PD_2$ are connected in series and the junction point of the first LRE $PD_1$ and the second LRE $PD_2$ is coupled to the amplifier 8. Various simple amplifiers such as (A) a transimpedance-type amplifier formed of one bipolar transistor and one transistor (see FIG. 1 of Japanese Patent Application (Pub. No. 57-140053) and FIG. 1 of Japanese Patent Application (Pub. No. 57-142031)), (B) a transimpedance-type amplifier formed of FETs (see National Technical Report, vol. 34, No. 1, p.36, February, 1988), and (C) a single power supply type operational amplifier such as AN1358 and AN6500, may be used as the amplifier 8. The circuit scale of photodetectors becomes smaller.

In the present embodiment, reverse-bias voltages are applied to the first and second LREs $PD_1$ and $PD_2$ formed of photodiodes connected together in series. One advantage of this arrangement is that each of the first and second LREs $PD_1$ and $PD_2$ has higher photosensitivity in comparison with in the state of zero bias. Additionally, the junction capacitance is reduced thereby improving the frequency characteristic.

By changing the area ratio of the first LRE $PD_1$ and the second LRE $PD_2$, the wavelength band of light to be detected can be changed easily. Suppose the second LRE's $PD_2$ area is doubled so that the area ratio of the first LRE $PD_1$ and the second LRE $PD_2$ becomes 5:2. Under this condition, the second LRE $PD_2$ has the photodetection characteristic 13 shown in FIG. 2, and the light wavelength at the intersection with the photodetection characteristic 10 makes a change from 880 nm down to 800 nm. This makes it possible to set a wavelength band in the range between 400 nm and 800 nm. The sensitivity to infrared is sufficiently reduced. Even a brightness close to the spectral luminous efficiency of the human eye can be detected.

Figure 3:
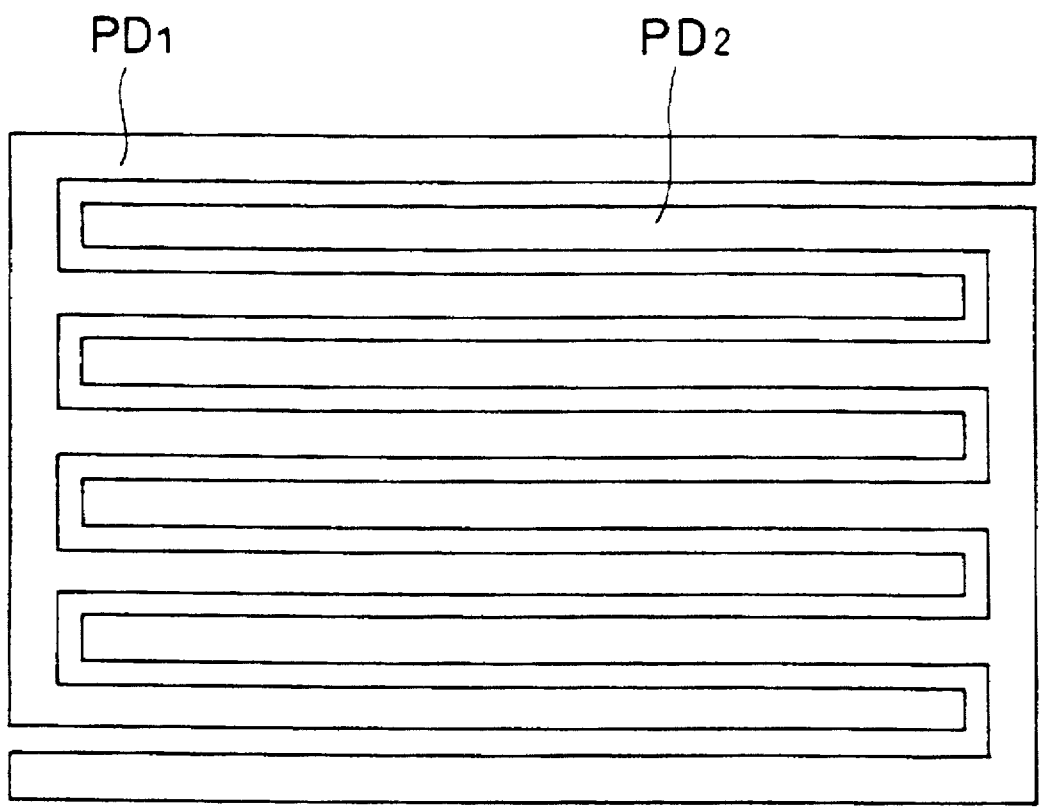
FIG. 3 is a top plan view illustrating the surface pattern of a first light-receiving element and the surface pattern of a second light-receiving element in a photodetector formed in accordance with the first embodiment.

FIG. 3 is a top plan view schematically showing an example of the placement of the first LRE $PD_1$ with the second LRE $PD_2$. As shown in the figure, the first and second LREs $PD_1$ and $PD_2$ fit in each other in multiple in a comb-like fashion. Even when each LRE is irradiated with a spot of light beams smaller than the LRE's area, the amount of light in a target wavelength band can be detected.

Figure 4:
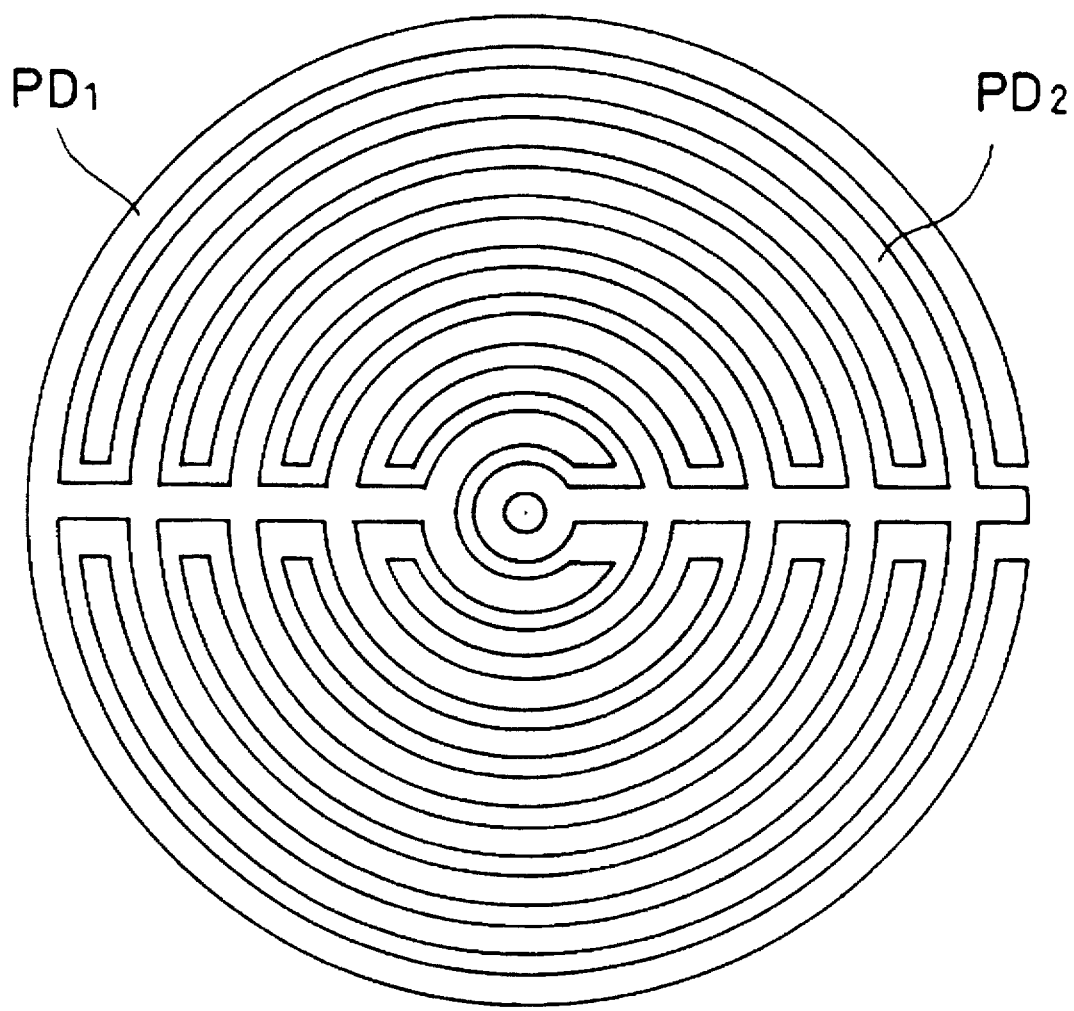
FIG. 4 is a top plan view illustrating the surface pattern of a first light-receiving element and the surface pattern of a second light-receiving element in a photodetector formed in accordance with the first embodiment.

FIG. 4 is a top plan view schematically showing another example of the placement of the first LRE $PD_1$ with the second LRE $PD_2$. As shown in the figure, the first and second LREs $PD_1$ and $PD_2$ fit in each other in multiple in an curbed fashion. The FIG. 4 placement provides the same effect as the FIG. 3 placement. Any other $PD_1$–$PD_2$ placement manner may be employed as long as the first and second LREs $PD_1$ and $PD_2$ fit in each other in multiple, with the same advantage as provided by each of the placement examples.

EMBODIMENT 2

The second embodiment is now described. In the present embodiment, the amplifier 8 of the first embodiment is formed by a bipolar transistor.

Figure 5:
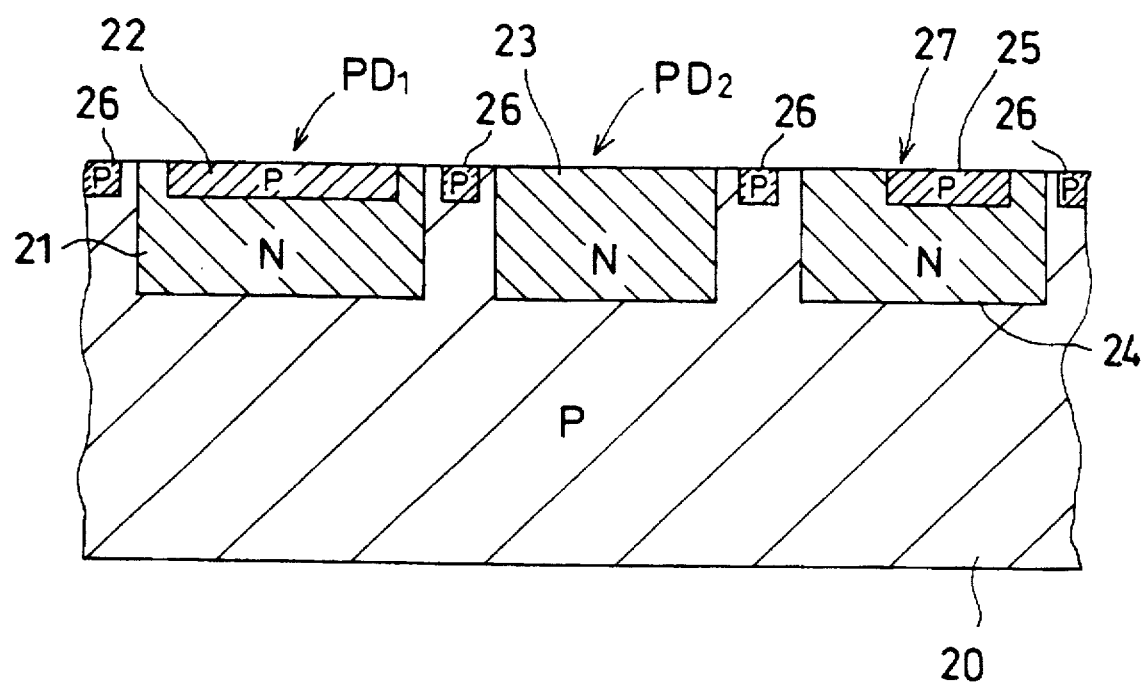
FIG. 5 depicts in cross section the structure of a photodetector formed in accordance with a second embodiment of the present invention.

FIG. 5 shows in cross section the structure of a photodetector formed in accordance with the second embodiment. $PD_1$ is a first LRE. $PD_2$ is a second LRE. 27 is a bipolar transistor. No interconnect lines are shown in the figure. 20 is a p-type semiconductor substrate. 21 is an n-type first impurity region. 22 is a p-type second impurity region. 23 is an n-type third impurity region. The bipolar transistor 27 has an n-type collector region 24 and a p-type base region 25. The first LRE $PD_1$ is a photodiode formed of the n-type first impurity region 21 and the p-type second impurity region 22. On the other hand, the second LRE $PD_2$ is a photodiode formed of the substrate 20 and the n-type third impurity region 23.

FIG. 7 is a circuit diagram showing a circuit structure of the FIG. 5 photodetector. The first and second LREs $PD_1$ and $PD_2$ are connected in series and fed respective reverse-bias voltages. The junction point of the first and second LREs $PD_1$ and $PD_2$ is connected with the base of a transistor $T_{r1}$. When beams of light fall upon the present photodetector, the photocurrent $I_1$ flows in the first LRE $PD_1$ and the photocurrent $I_2$ flows in the second LRE $PD_2$. The difference between $I_1$ and $I_2$, i.e., the differential photocurrent $I_3$, flows into the base of the transistor $T_{r1}$, whereupon a current, which is proportional to the amount of light in a target wavelength band, is obtained.

In accordance with the present embodiment, the bipolar transistor 27 acts as the amplifier 8 of the first embodiment. This achieves LRE and amplifier integration. As a result, the circuit scale of photodetectors becomes smaller.

Diffusion processing may be simplified by making the p-type second impurity region 22 identical with the base region 25 in depth. Additionally, diffusion processing may be simplified by making the first and third impurity regions 21, 23 identical with the collector region 24 in depth. Such arrangement facilitates not only LRE integration but also bipolar transistor (amplifier) integration.

Next, a process of fabricating the present photodetector is described. In the step of forming the collector region 24 by diffusion, the first and third impurity regions 21 and 23 are also formed. Subsequently, in the step of forming the base region 25 by diffusion, the p-type second impurity region 22 is also formed. As a result of such arrangement, the first and second LREs $PD_1$ and $PD_2$ are formed at the same time as the bipolar transistor 27 is formed. This prevents increase in the number of diffusion steps due to the integration. The bipolar transistor 27 is formed in the following way. The collector region 24 is formed by introducing an n-type impurity into the substrate 20. The base region 25 is formed by introducing a p-type impurity into the collector region 24. The emitter region (not shown) is formed by introducing an n-type impurity into the base region 25.

EMBODIMENT 3

Figure 6:
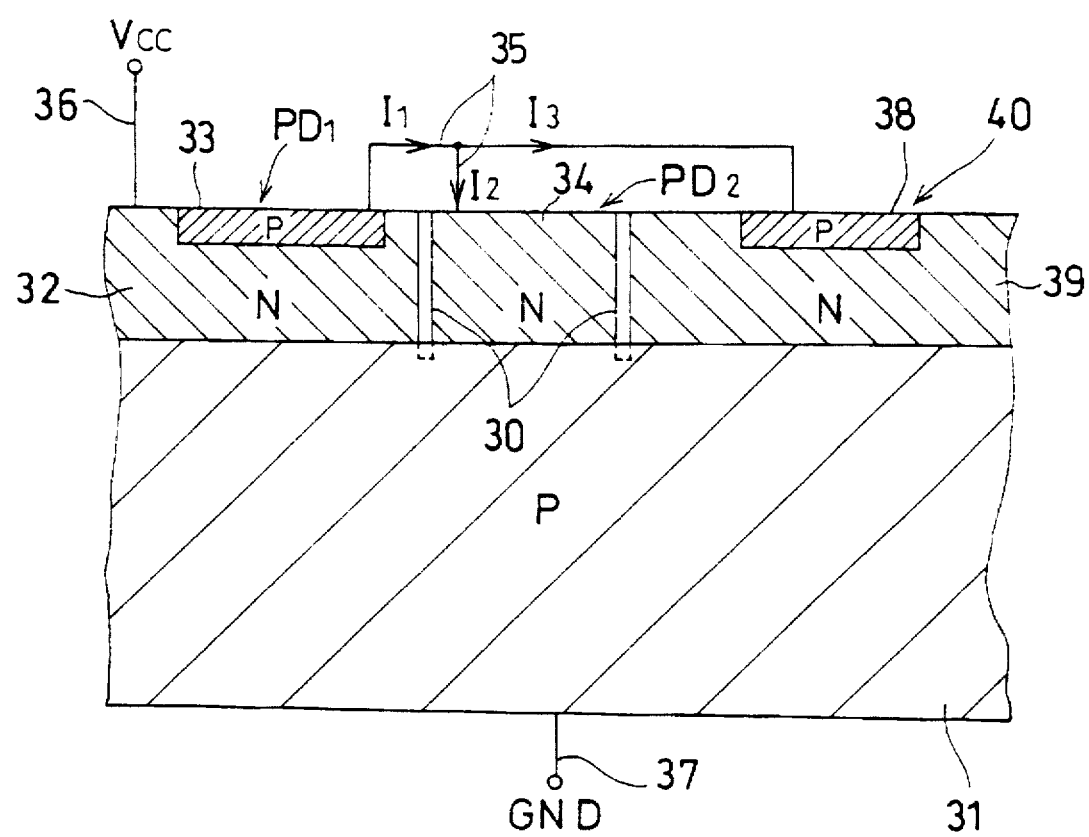
FIG. 6 depicts the structure of a photodetector formed in accordance with a third embodiment of the present invention.

The third embodiment is now described. FIG. 6 shows in cross section the structure of a photodetector formed in accordance with the present embodiment. $PD_1$ is a first LRE. $PD_2$ is a second LRE. 40 is a bipolar transistor acting as an amplifier. 30 is a p-type isolation region. 31 is a p-type semiconductor substrate. 32 is an n-type first impurity region formed of an epitaxial layer. 33 is a p-type second impurity region formed of an epitaxial layer. 34 is an n-type third impurity region formed of an epitaxial layer. 35, 36, and 37 are interconnect lines. 38 is a p-type impurity region. 39 is an n-type impurity region formed of an epitaxial layer as a region where an amplifier is formed. The impurity region 38 becomes the transistor's 40 base region. The impurity region 39 becomes the transistor's 40 collector region.

The present photodetector has, as its major elements, the first and second LREs $PD_1$, $PD_2$ and the bipolar transistor 40. The isolation regions 30 are for isolation between the first LRE $PD_1$ and the second LRE $PD_2$, and for isolation between the LREs $PD_1$ and $PD_2$, and the transistor 40.

The first LRE $PD_1$, which is grown on the semiconductor substrate 31 by epitaxial growth, is a photodiode that detects light of short wavelengths and has a peak sensitivity wavelength of 560 nm. This photodiode is formed of the n-type first impurity region 32 and the p-type second impurity region 33. Whereas the n-type first impurity region 32 is a lightly phosphorus-doped, deep region (surface concentration: $10^{-16}$ cm$^{-2}$; depth: above 5 μm), the p-type second impurity region 33 is a boron-doped, shallow region formed at a surface zone of the n-type first impurity region 32 (surface concentration: $10^{-18}$ cm$^{-2}$; depth: below 2 μm).

The second LRE $PD_2$ is a photodiode which detects light of long wavelengths and has a peak sensitivity wavelength of 880 nm. This photodiode is formed of the substrate 31 and the n-type third impurity region 34 which is a lightly phosphorus-doped, deep region formed by epitaxial growth (surface concentration: $10^{-16}$ cm$^{-2}$; depth: 5 μm).

The p-type second impurity region 33 of the first LRE $PD_1$ and the n-type third impurity region 34 of the second LRE PD$_2$ are connected together by the line 35 of aluminum, to connect the first LRE PD$_1$ and the second LRE PD$_2$ in series and the junction point of the first LRE PD$_1$ and the second LRE PD$_2$ is coupled to the base region 38 of the bipolar transistor 40. The circuit configuration of the FIG. 6 photodetector is identical with the circuit configuration of the photodetector according to the second embodiment (see FIG. 7).

As in the first embodiment, the first LRE PD$_1$ and the second LRE PD$_2$ are placed in such a fashion that they fit in each other in multiple (see FIGS. 3 and 4).

The present embodiment differs from the first embodiment in that the first, third, and fourth impurity regions 32, 34, and 39 are formed of an epitaxial layer and they are separated from one another by the isolation regions 30. These regions 30 are p-type impurity regions which extend, through the epitaxial layers (32, 34, and 39), respectively, to the semiconductor substrate 31.

The operation of the FIG. 6 photodetector is the same as that of the first embodiment's photodetector. The line 36 is connected with V$_{CC}$. The line 37 is connected with GND. The first and second LREs PD$_1$ and PD$_2$ are fed respective reverse-bias voltages. When the first and second LREs PD$_1$ and PD$_2$ are irradiated with light, the photocurrent I$_1$ flows in the first LRE PD$_1$ according to the photodetection characteristic (peak light wavelength ($\lambda$)=560 nm) and the photocurrent I$_2$ flows in the second LRE PD$_2$ according to the photodetection characteristic (peak light wavelength ($\lambda$)=880 nm). The difference between I$_1$ and I$_2$, i.e., the differential current I$_3$, is amplified by the amplifier 40. Therefore, the present embodiment provides the same effect as the first embodiment.

In the present embodiment, the first and third impurity regions 32 and 34 are simultaneously uniformly formed from an epitaxial layer, having a low impurity concentration. This gives a longer lifetime to carriers formed by light irradiation. The absorptivity is enhanced and the photosensitivity is improved to a higher level.

The bipolar transistor 40, which acts as an amplifier, is formed in the n-doped, epitaxial layer region 34 separated by the isolation region 30. As a result of such arrangement, photodetector integration becomes easy, the circuit scale is reduced, noise is reduced, and the costs of production are cut down.

Diffusion processing may be simplified by making the p-type second impurity region 33 identical in depth with the base region 38 of the bipolar transistor 40. Additionally, diffusion processing may be simplified by making the first and third impurity regions 32, 34 identical in depth with the collector region 39 of the bipolar transistor 40. Such arrangement facilitates not only LRE integration but also bipolar transistor (amplifier) integration.

Next, a process of fabricating the present photodetector is described. In the step of growing an epitaxial layer which forms the region 39 (i.e., the transistor's 40 collector region), the n-type first impurity region 32 and the n-type third impurity region 34 are also formed. Subsequently, in the step of forming the region 38 (i.e., the transistor's 40 base region), the p-type second impurity region 33 is also formed. The first and second LREs PD$_1$ and PD$_2$ are formed at the same time as the amplifier (i.e., the bipolar transistor 40) is formed. This prevents increase in the number of diffusion steps due to the integration.

In each of the first to third embodiments, the first conductivity type is p-type and the second conductivity type is n-type. Even in cases where the first conductivity type is n-type and the second conductivity type is p-type, the same effect can be obtained.

The operation of the FIG. 7 circuit is described. The first and second LREs PD$_1$ and PD$_2$ are connected together in series. The cathode of the first LRE PD$_1$ is coupled to V$_{CC}$. The anode of the second LRE PD$_2$ is connected to GND. The first and second LREs PD1 and PD2 are fed respective reverse-bias voltages. The collector of the npn transistor T$_{r1}$ is connected to I$_{OUT}$ (the output terminal), the emitter to GND (ground), and the base to the anode of the first LRE PD$_1$ and to the cathode of the second LRE PD$_2$. If the base-emitter voltage of the transistor T$_{r1}$=V$_{BE}$, then the first and second LREs PD$_1$ and PD$_2$ are provided with reverse-bias voltages of (V$_{CC}$−V$_{BE}$) and V$_{BE}$, respectively. This enables each LRE to have high photosensitivity.

When the first and second LREs PD$_1$ and PD$_2$ are illuminated with light, the photocurrent I$_1$ flows in the first LRE PD$_1$ and the photocurrent I$_2$ flows in the second LRE PD$_2$, according to their respective photodetection characteristics. The difference between I$_1$ and I$_2$ (i.e., the differential current I$_3$) flows into the base of the transistor T$_{r1}$. As a result, a current of h$_{FE1}$×I$_3$, where h$_{FE1}$ is the current amplification factor of the transistor T$_{r1}$, flows out at the I$_{OUT}$ terminal. The magnitude of that current is proportional to the amount of light in a wavelength band set by the first and second LREs PD$_1$ and PD$_2$.

Figure 8A:
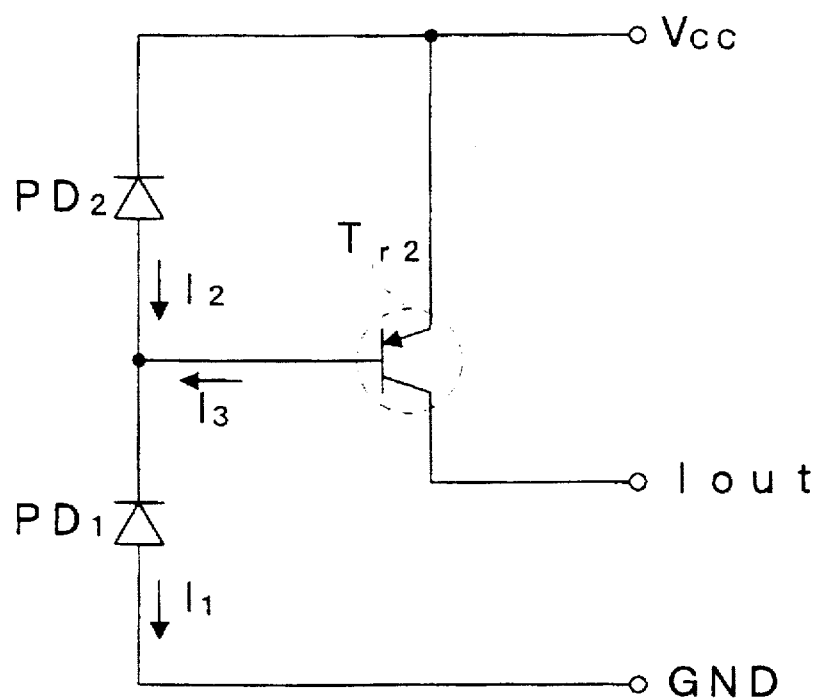
FIGS. 8(a) and 8(b) each show a circuit structure according to the present invention.
Figure 8B:
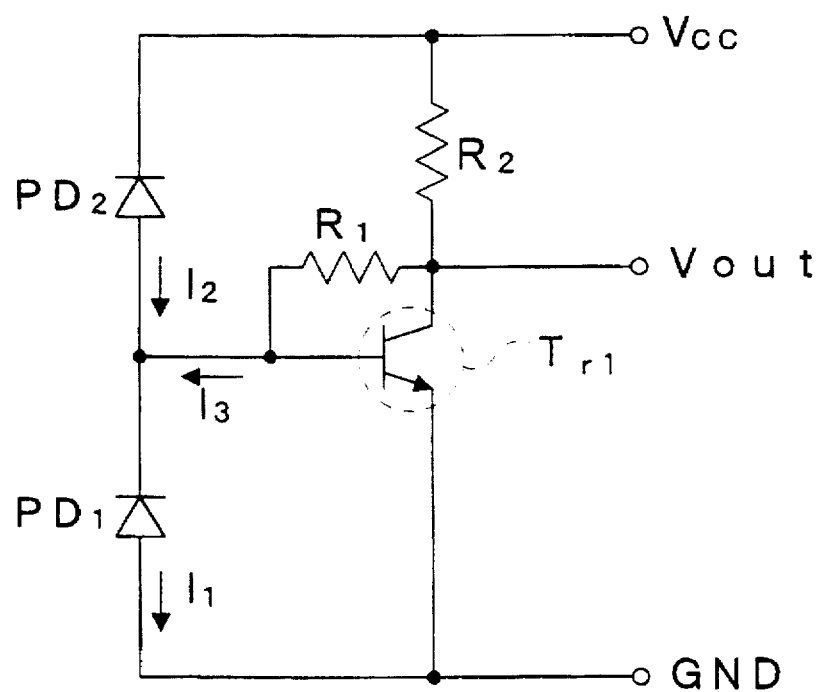

Different circuit configurations other than the one shown in FIG. 7 may be employed. FIGS. 8(a) and 8(b) each show an example.

The FIG. 8(a) circuit configuration employs a pnp transistor T$_{r2}$ instead of T$_{r1}$. The first and second LREs PD$_1$ and PD$_2$ are connected together in series. The cathode of the first LRE PD$_2$ is coupled to V$_{CC}$ and the anode of the first LRE PD$_1$ is grounded. The first and second LREs PD$_1$ and PD$_2$ are fed respective reverse-bias voltages. The collector, emitter, and base of the transistor T$_{r2}$ are coupled to the I$_{OUT}$ terminal, to V$_{CC}$, and to the cathode of the first LRE PD$_1$ and to the anode of the second LRE PD$_2$, respectively. If the base-emitter voltage of the transistor T$_{r2}$=V$_{BE}$, then the first and second LREs PD$_1$ and PD$_2$ are provided with reverse-bias voltages of (V$_{CC}$−V$_{BE}$) and V$_{BE}$, respectively. This enables each LRE to have high photosensitivity.

When the first and second LREs PD$_1$ and PD$_2$ are illuminated with light, the photocurrent I$_1$ flows in the first LRE PD$_1$ and the photocurrent I$_2$ flows in the second LRE PD$_2$, according to their respective photodetection characteristics. The difference between I$_1$ and I$_2$ (i.e., the differential current I$_3$=I$_1$−I$_2$) flows out at the base of the transistor T$_{r2}$. As a result, a current of h$_{FE2}$×I$_3$, where h$_{FE1}$ is the current amplification factor of the transistor T$_{r2}$, flows in at the I$_{OUT}$ terminal. The magnitude of that current is proportional to the amount of light in a wavelength band set by the first and second LREs PD$_1$ and PD$_2$.

Further, like the FIG. 7 circuit, the first and second LREs PD$_1$ and PD$_2$ are connected together in series and are provided with respective reverse-bias voltages. Therefore, the LRE has higher photosensitivity than in the zero-bias state. The light-receiving area can be reduced, and it is possible to make the circuit scale smaller because of the availability of various amplifiers.

The FIG. 8(b) circuit employs an npn transistor T$_{r1}$, a resistor R$_1$, and a resistor R$_2$. The first and second LREs PD$_1$ and PD$_2$ are connected together in series. The cathode of the second LRE PD$_2$ is coupled to V$_{CC}$ and the anode of the first LEE PD$_1$ is grounded. The first and second LREs PD$_1$ and PD$_2$ are fed respective reverse-bias voltages. The collector, emitter, and base of the transistor $T_{r1}$ are coupled to the $V_{OUT}$ terminal, to GND, and to the cathode of the first LRE $PD_1$ and to the anode of the second LRE $PD_2$, respectively. The resistor $R_1$ is connected between the base and the collector of the transistor $T_{r1}$. The resistor $R_2$ is connected between the collector of the transistor $T_{r1}$ and $V_{CC}$. The first and second LREs $PD_1$ and $PD_2$ are provided with reverse-bias voltages of $V_{BE}$ and $(V_{CC}-V_{BE})$, respectively. This enables each LRE to have high photosensitivity.

When the first and second LREs $PD_1$ and $PD_2$ are illuminated with light, the photocurrent $I_1$ flows in the first LRE $PD_1$ and the photocurrent $I_2$ flows in the second LRE $PD_2$, according to their respective photodetection characteristics. A voltage, expressed by the following equation, is applied to the $V_{OUT}$ terminal.

$$V_{OUT}=A+B\times(I_1-I_2)$$

$$A=(R_1V_{CC}+(R_2+R_2h_{FE})V_{BE})/(R_2+R_2h_{FE}+R_1)$$

$$B=R_1R_2h_{FE}/(R_2+R_2h_{FE}+R_1)$$

Since $R_1$, $R_2$, $h_{FE}$, $V_{BE}$, and $V_{CC}$ are constants, "A" and "B" are constants. Therefore, the voltage $V_{OUT}$ is proportional to the amount of light in a wavelength band set by the first and second LREs $PD_1$ and $PD_2$.

Further, like the FIG. 7 circuit, the first and second LREs $PD_1$ and $PD_2$ are connected together in series and are provided with respective reverse-bias voltages. Therefore, the LRE has higher photosensitivity than in the zero-bias state. The area of the LRE can be reduced, and it is possible to make the circuit scale smaller because of direct connection with, for example, microcomputers.

EMBODIMENT 4

Figure 9:
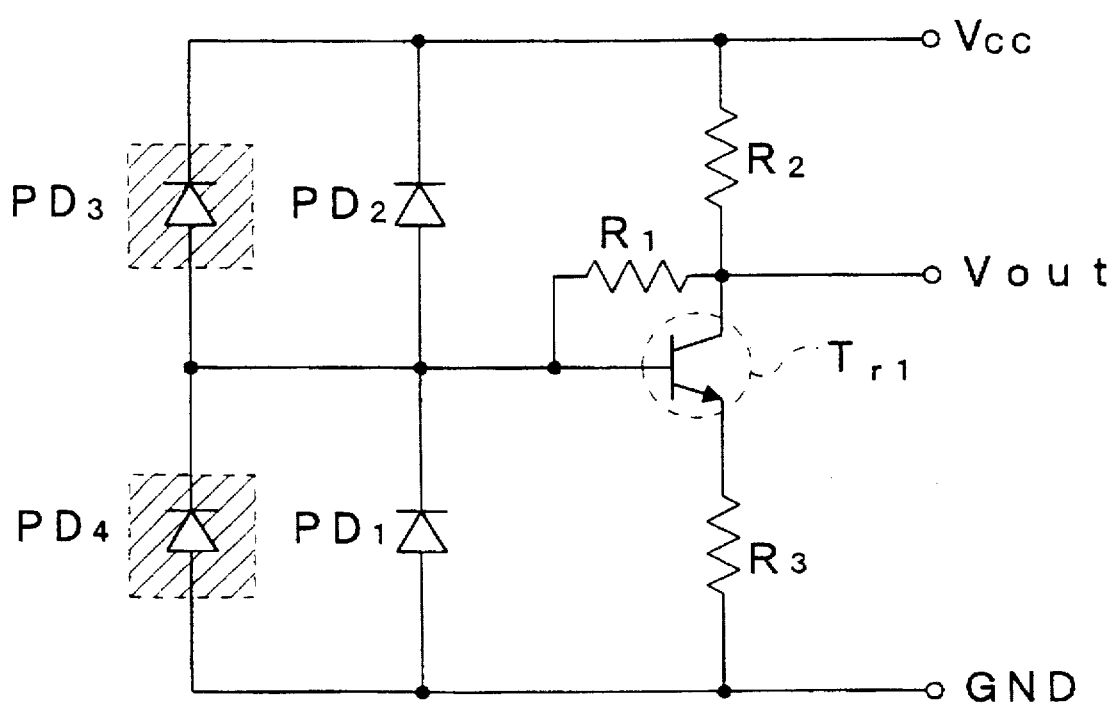
FIG. 9 depicts the structure of a photodetector formed in accordance with a fourth embodiment of the present invention.
Figure 10:
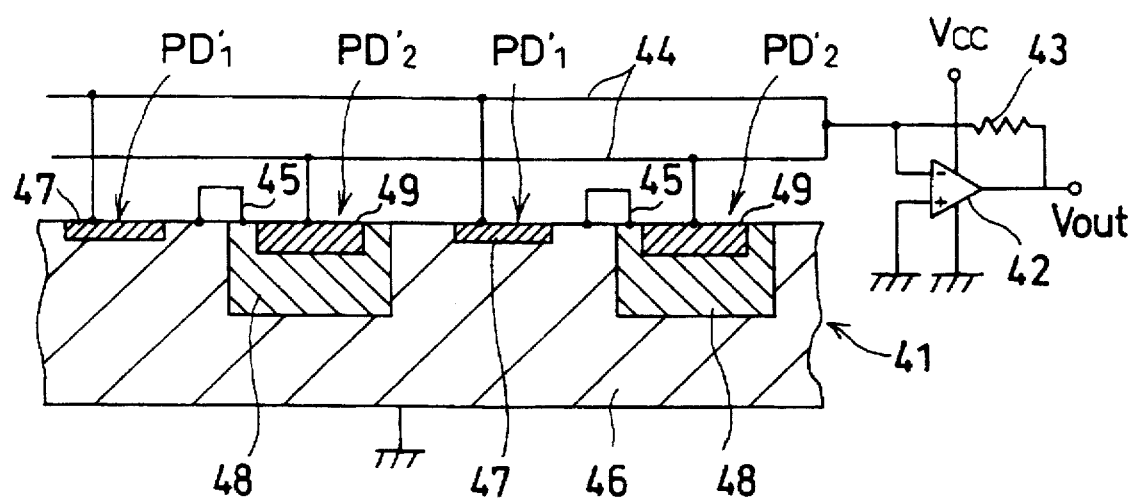
FIG. 10 depicts the structure of a conventional photodetector.

FIG. 9 shows a circuit diagram of a photodetector with four light-receiving elements, three resistors, and one transistor formed in accordance with the fourth embodiment. The first and second LREs $PD_1$ and $PD_2$ are connected together in series. The third and fourth LREs $PD_3$ and $PD_4$ are connected together in series. The anodes of the first and fourth LREs $PD_1$ and $PD_4$ are grounded. The cathodes of the second and third LREs $PD_2$ and $PD_3$ are associated with $V_{CC}$. The cathodes of the first and fourth LREs $PD_1$ and $PD_4$ and the anodes of the second and third LREs $PD_2$ and $PD_3$ are all connected with the base of the npn transistor $T_{r1}$.

The resistor $R_1$ is connected between the collector and the base of the transistor $T_{r1}$. The resistor $R_2$ is connected between the collector of the transistor $T_{r1}$ and $V_{CC}$. The resistor $R_3$ is connected between the emitter of the transistor $T_{r1}$ and GND. The value of $R_3$ is controlled in order that each LRE $PD_1$, $PD_2$, $PD_3$, $PD_4$ is provided with a reverse-bias voltage $V_{CC}/2$.

The first and third LREs $PD_1$ and $PD_3$ are identical with each other in photodetection characteristic. Likewise, the second and fourth LREs $PD_2$ and $PD_4$ are identical with each other in photodetection characteristic. By "be identical with each other in photodetection characteristic", what is meant is that both LREs are identical with each other in the depth, in the light-receiving area, in the wavelength characteristic of the light-receiving sensitivity, and in the temperature-dependence of, for example, the dark current. The surfaces of the third and fourth LREs $PD_3$ and $PD_4$ are shielded from light beams.

The FIG. 9 circuit has the advantage that it is able to prevent the occurrence of an offset potential caused by dark current flowing in each LRE. In a photodetector employing either the FIG. 7 circuit configuration or the FIG. 8 circuit configuration, dark current always flows in both the first and second LREs $PD_1$ and $PD_2$, as a result of which an offset potential $V_{off}$ results. Further, the dark current exponentially increases depending upon the temperature. Therefore, a high offset potential $V_{off}$ is generated at a high temperature.

In the FIG. 8(b) circuit, if a dark current flowing in the first LRE $PD_1=I_{d1}$ and a dark current flowing in the second LRE $PD_2=I_{d2}$, then $V_{off}=B\cdot(I_{d1}-I_{d2})$. $(I_{d1}-I_{d2})$ is several nA at 25 degrees centigrade and is tens of nA at 75 degrees centigrade. If $R_1$ is hundreds of $M\Omega$, then $V_{off}$ is about 500 mv at room temperature but is about 5 V at 75 degrees centigrade therefore preventing normal operations.

Conversely, in the FIG. 9 circuit, if $I_{d1}$, $I_{d2}$, $I_{d3}$, and $I_{d3}$ flow in $PD_1$, $PD_2$, $PD_3$, and $PD_4$, respectively, then $V_{off}=R_1\cdot\{(I_{d1}-I_{d2})-(I_{d3}-I_{d4})\}$. The first and third LREs $PD_1$ and $PD_3$ are identical in the dark current characteristic with each other. The second and fourth LREs $PD_2$ and $PD_4$ are identical in the dark current characteristic with each other. Each LRE is fed the same reverse-bias voltage. As a result, $I_{d1}$ becomes equal to $I_{d3}$, and $I_{d2}$ becomes equal to $I_{d4}$. Theoretically, $V_{off}$ becomes zero. Practically, $V_{off}$ is about 10 mV at 25 degrees centigrade and is about 100 mV at 75 degrees centigrade because of variations in the LRE characteristic.

In this way, the occurrence of an offset potential due to the presence of dark current flowing in each LRE can be prevented in the present photodetector.

The invention claimed is:

1. A photodetector comprising:
   (a) a first light-receiving element;
   said first-receiving element including:
      a first impurity region of the second conductivity type which is formed on a semiconductor substrate of the first conductivity type;
      a second impurity region of the first conductivity type which is formed on said first impurity region;
   (b) a second light-receiving element;
   said second light-receiving element including:
      said substrate;
      a third impurity region of the second conductivity type which is formed on said substrate;
      said second light-receiving element differing in photodetection characteristic from said first light-receiving element;
      said second light-receiving element being coupled in series to said first light-receiving element;
   (c) amplification means for inputting, from a junction point of said first light-receiving element and said second light-receiving element, a differential current which is the difference between a photocurrent generated in said first light-receiving element and another photocurrent generated in said second light-receiving element, and for amplifying said differential current.

2. A photodetector according to claim 1 wherein said amplification means has an amplifier composed of a plurality of impurity regions formed on said substrate.

3. A photodetector according to claim 2 wherein at least one of said plural impurity regions which compose said amplifier is identical in impurity region depth with at least one of said first, second, and third impurity regions.

4. A photodetector according to claim 1 wherein said first and second light-receiving elements are fed respective reverse-bias voltages.

5. A photodetector according to claim 1 wherein a wavelength band for photodetection is set according to the area ratio of said first light-receiving element and said second light-receiving element.

6. A photodetector according to claim 1 wherein said first and second light-receiving elements have surface patterns that fit in each other in multiple.

7. A photodetector comprising:
   (a) a first light-receiving element;
   said first light-receiving element including:
      a first impurity region of the second conductivity type formed of an epitaxial layer grown on a semiconductor substrate of the first conductivity type;
      a second impurity region of the first conductivity type which is formed on said first impurity region;
   (b) a second light-receiving element;
   said second light-receiving element including:
      said substrate;
      a third impurity region of the second conductivity type formed of said epitaxial layer;
      said second light-receiving element differing in photodetection characteristic from said first light-receiving element;
      said second light-receiving element being coupled in series to said first light-receiving element;
   (c) an isolation region for separating said epitaxial layer into said first and third impurity regions;
   (d) amplification means for inputting, from a junction point of said first light-receiving element and said second light-receiving element, a differential current which is the difference between a photocurrent generated in said first light-receiving element and another photocurrent generated in said second light-receiving element, and for amplifying said differential current.

8. A photodetector according to claim 7,
   said photodetector further comprising an amplifier formation region which is formed of said epitaxial layer and which is separated by an isolation region from said first and third impurity regions;
   said amplification means including an amplifier composed of a plurality of impurity regions formed in said amplifier formation region.

9. A photodetector according to claim 8 wherein said amplifier is a bipolar transistor with a base region coupled to a junction point of said first and second light-receiving elements, said base region having the same depth as said second impurity region.

10. A photodetector according to claim 7 wherein said first and second light-receiving elements are fed respective reverse-bias voltages.

11. A photodetector according to claim 7 wherein a wavelength band for photodetection is set according to the area ratio of said first light-receiving element and said second light-receiving element.

12. A photodetector according to claim 7 wherein said first and second light-receiving elements have surface patterns that fit in each other in multiple.

13. A photodetector comprising:
   (a) a first light-receiving element and a second light-receiving element, said elements being connected together in series;
   (b) a third light-receiving element;
   said third light-receiving element being connected in parallel with said second light-receiving element;
   said third light-receiving element being identical in dark current characteristic with said first light-receiving element;
   said third light-receiving element being covered from light;
   (c) a fourth light-receiving element;
   said fourth light-receiving element being connected in parallel with said first light-receiving element;
   said fourth light-receiving element being identical in dark current characteristic with said second light-receiving element;
   said fourth light-receiving element being covered from light;
   (d) amplification means for inputting, from a junction point of said first light-receiving element and said second light-receiving element, a differential current which is the difference between a photocurrent generated in said first light-receiving element and another photocurrent generated in said second light-receiving element, and for amplifying said different current.

14. A photodetector according to claim 13 wherein said first, second, third, and fourth light-receiving elements are fed equal reverse-bias voltages.

15. In a method of fabricating a photodetector, said photodetector having:
   (a) a first light-receiving element;
   said first-receiving element including:
      a first impurity region of the second conductivity type which is formed on a semiconductor substrate of the first conductivity type;
      a second impurity region of the first conductivity type which is formed on said first impurity region;
   (b) a second light-receiving element;
   said second light-receiving element including:
      said substrate;
      a third impurity region of the second conductivity type which is formed on said substrate;
      said second light-receiving element differing in photodetection characteristic from said first light-receiving element;
      said second light-receiving element being coupled in series to said first light-receiving element;
   (c) amplification means having an amplifier composed of a plurality of impurity regions formed on said substrate for inputting, from a junction point of said first light-receiving element and said second light-receiving element, a differential current which is the difference between a photocurrent generated in said first light-receiving element and another photocurrent generated in said second light-receiving element, and for amplifying said differential current;
   said method comprising the step of:
      forming at least one of said plurality of impurity regions which compose said amplifier simultaneously with at least one of said first, second, and third impurity regions in a one stage diffusion process.

16. In a method of fabricating a photodetector, said photodetector having:
   (a) a first light-receiving element;
   said first light-receiving element including:
      a first impurity region of the second conductivity type formed of an epitaxial layer grown on a semiconductor substrate of the first conductivity type;
      a second impurity region of the first conductivity type which is formed on said first impurity region;

(b) a second light-receiving element;
said second light-receiving element including:
   said substrate;
   a third impurity region of the second conductivity type formed of said epitaxial layer;
   said second light-receiving element differing in photo-detection characteristic from said first light-receiving element;
   said second light-receiving element being coupled in series to said first light-receiving element;

(c) a bipolar transistor having a base region;
   said base region being formed in an epitaxial layer separated by an isolation region from said first and third impurity regions;
   said base region being connected with a junction point of said first light-receiving element and said second light-receiving element;

said method comprising the step of:
   forming said base region simultaneously with said second impurity region in a one stage diffusion process.

* * * * *